(12) United States Patent
Ha et al.

(10) Patent No.: US 8,034,746 B2
(45) Date of Patent: Oct. 11, 2011

(54) METHOD OF MANUFACTURING ROUND WIRE USING SUPERCONDUCTING TAPE AND ROUND WIRE MANUFACTURED USING THE SUPERCONDUCTING TAPE

(75) Inventors: Hong Soo Ha, Changwon-si (KR); Sang Soo Oh, Changwon-si (KR); Dong Woo Ha, Changwon-si (KR); Rock Kil Ko, Gimhae-si (KR); Ho Sup Kim, Gimhae-si (KR)

(73) Assignee: Korea Electrotechnology Research Institute (KR)

( * ) Notice: Subject to any disclaimer, the term of this patent is extended or adjusted under 35 U.S.C. 154(b) by 289 days.

(21) Appl. No.: 12/495,350

(22) Filed: Jun. 30, 2009

(65) Prior Publication Data

US 2010/0137142 A1 Jun. 3, 2010

(30) Foreign Application Priority Data

Dec. 3, 2008 (KR) ........................ 10-2008-0121801

(51) Int. Cl.
*H01L 39/24* (2006.01)
*H01B 12/00* (2006.01)
*H01B 12/04* (2006.01)
*H01B 13/00* (2006.01)
*H01B 13/34* (2006.01)

(52) U.S. Cl. ........ 505/430; 505/230; 505/236; 505/433; 505/470; 505/472; 174/125.1; 29/599; 427/437; 427/443.1; 204/192.24

(58) Field of Classification Search .................. 505/150, 505/230, 231, 236–237, 430, 433, 470, 472, 505/704, 705; 174/125.1; 29/599; 335/216; 361/19; 228/101, 180.5, 208, 235.2, 259; 204/192.24; 205/51, 126, 167; 427/62, 304, 427/305, 437, 443.1
See application file for complete search history.

(56) References Cited

U.S. PATENT DOCUMENTS 7,674,751 B2 * 3/2010 Malozemoff et al. .......... 505/430
7,781,376 B2 * 8/2010 Kodenkandath et al. ...... 505/235

FOREIGN PATENT DOCUMENTS

| KR | 10-0201752 B1 | 3/1999 |
| KR | 10-2002-0019323 A | 3/2002 |
| KR | 10-2002-0049953 A | 6/2002 |
| KR | 10-2003-0012273 A | 2/2003 |

* cited by examiner

*Primary Examiner* — Stanley Silverman
*Assistant Examiner* — Kallambella Vijayakumar
(74) *Attorney, Agent, or Firm* — Park & Associates IP Law, P.C.

(57) ABSTRACT

Disclosed herein is a method of manufacturing round wire using superconducting tape, including the steps of: slitting superconducting tape into superconducting tape strips; silver-coating the slit superconducting tape strips; laminating the silver-coated superconducting tape strips to form a superconducting tape laminate having a square cross-section; holding the superconducting tape laminate; heat-treating the fixed superconducting tape laminate to cause diffusion junction between silver; and copper-plating the heat-treated superconducting tape laminate to have a circular section. The method is advantageous in that, since it is formed by slitting, silver-coating and laminating conventional superconducting tape, its superconducting layer can be protected, and it has a circular cross-section, so that it can be easily joined and wound, with the result that it is expected that, like general copper wires, its application fields will be enlarged because it can be wound in a solenoid shape at the time of magnetic winding.

4 Claims, 1 Drawing Sheet

METHOD OF MANUFACTURING ROUND WIRE USING SUPERCONDUCTING TAPE AND ROUND WIRE MANUFACTURED USING THE SUPERCONDUCTING TAPE

FIELD OF THE INVENTION

The present invention relates to a method of manufacturing round wire using superconducting tape and a round wire manufactured using the superconducting tape, and, more particularly, to a method of manufacturing round wire using superconducting tape, in which superconducting tape is slit, laminated, coated with silver and then plated with copper to make a round wire which is easily joined and wound, and round wire manufactured using the superconducting tape.

BACKGROUND OF THE INVENTION

Generally, superconducting wire includes a metal substrate, a superconducting layer, and a buffer layer for minimizing the difference in material properties between the metal substrate and the superconducting layer.

Such superconducting wire must be used together with a stabilizing material made of metal because it is difficult to pass a high current of 1000 A or more through superconducting wire and the metal substrate cannot be used as a stabilizing material due to the buffer layer. Therefore, in order to conduct a large current, several superconducting wires are assembled and then used, and a metal stabilizing material is generally placed therearound.

Generally, in order to assemble the superconducting wires, they are connected in parallel to each other by soldering. The assembled superconducting wires are joined with a metal stabilizing material through soldering. That is, both the assembling of the superconducting wires and the joining of the assembled superconducting wires with the metal stabilizing material are realized through soldering.

In the assembling of the superconducting wires and the joining of the assembled superconducting wires with the metal stabilizing material through soldering, since the resistance between the superconducting wires is relatively high, the inconvenience in a permanent current operation, which is an original function of a semiconductor, results. Further, since the entire resistance of the assembled semiconducting wires is not uniform, for example, their soldered portions are detached therefrom, current excessively flows in one direction, so that the temperature in the superconducting wires is increased, thereby causing a breakdown of the superconducting state.

In order to solve the above problems, various technologies for joining superconducting wires have been disclosed. For example, Korean Patent Registration No. 10-0360292 discloses a technology of longitudinally connecting superconducting wires, Korean Patent Registration No. 10-0392511 discloses a technology of electrically plating superconducting wires with a metal stabilizing material, Korean Patent Registration Nos. 10-0380630 and 10-0394229 disclose technologies for improving the junction between filaments of multi-core superconducting wires, Korean Patent Registration No. 10-0201752 discloses a technology of manufacturing a multi-core superconducting wire by extruding a bullet composed of superconducting powder and stabilizing material and then coating the bullet with a stabilizing material, and Korean Unexamined Patent Application Publication No. 10-2005-0010228 discloses a technology of joining superconducting wires to normal conductive parts in order to reduce the resistance of the normal conductive parts in a superconducting system.

That is, the above conventional technologies include a technology of longitudinally connecting superconducting wires, a technology of electrically plating superconducting wires with a metal stabilizing material, a technology of performing the junction between filaments of multi-core superconducting wires, a technology of coating a bullet-shaped superconducting wire with a stabilizing material, and a technology of reducing the resistance of normal conductive parts through soldering.

However, the above conventional technologies are problematic in that they require a lot of time and high production cost, and in that, when a superconducting wire coated with a metal stabilizing material is connected to another superconducting wire or an electric connector, soldering must be further performed, so that the heat generated through the soldering influences the previously soldered parts, with the result that the previously soldered parts are separated from the superconducting wire and thus the critical current of a superconducting layer is decreased, thereby incurring the inconvenience in a permanent current operation.

Further, there is a problem in that conventional superconducting wires having square sections cannot be easily joined and wound.

SUMMARY OF THE INVENTION

Accordingly, the present invention has been made to solve the above-mentioned problems, and an object of the present invention is to provide a method of manufacturing a round wire using superconducting tape, in which conventional superconducting tape is slit, laminated, coated with silver and then plated with copper to make a round wire which is easily joined and wound, and round wire manufactured using the superconducting tape.

An aspect of the present invention provides a method of manufacturing round wire using superconducting tape, including the steps of: slitting superconducting tape into superconducting tape strips; silver-coating the slit superconducting tape strips; laminating the silver-coated superconducting tape strips to form a superconducting tape laminate having a square cross-section; holding the superconducting tape laminate; heat-treating the fixed superconducting tape laminate to cause diffusion junction between silver; and copper-plating the heat-treated superconducting tape laminate to have a circular section.

In the holding the superconducting tape laminate, the superconducting tape laminate may be spirally wound with a silver wire or may be wound on a drum having a spiral groove.

Another aspect of the present invention provides a round wire, including: a superconducting part having a square cross-section, which is formed by slitting, silver-coating and laminating superconducting tape; and a copper plating part, which is formed by copper-plating the superconducting part to have a circular section.

BRIEF DESCRIPTION OF THE DRAWINGS

The above and other objects, features and advantages of the present invention will be more clearly understood from the following detailed description taken in conjunction with the accompanying drawing, in which.

DETAILED DESCRIPTION OF THE INVENTION

Figure 1:
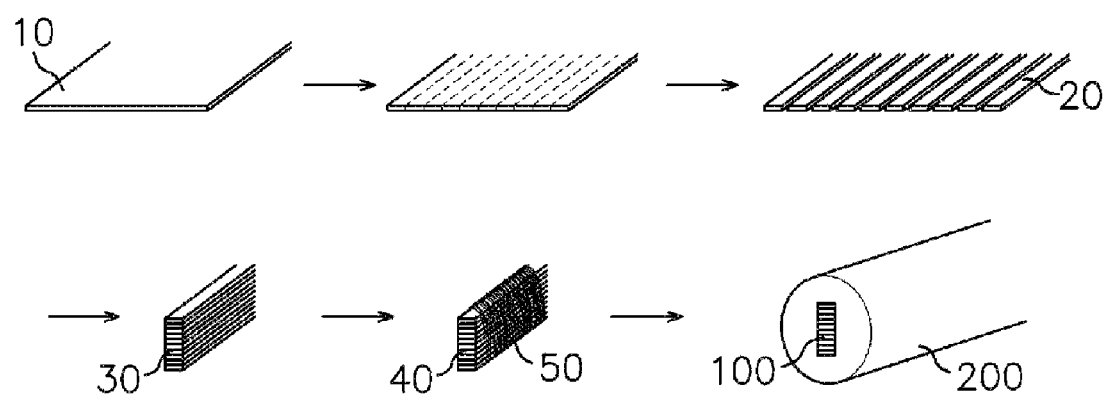
FIG. 1 is a schematic view showing a method of manufacturing round wire using superconducting tape according to the present invention.

The present invention relates to a method of manufacturing round wire using superconducting tape, in which a superconducting tape is longitudinally slit, coated with silver (Ag), vertically laminated and then thickly plated with copper to form a superconducting wire having a square section. This round wire is advantageous in that it can be easily joined and wound compared to conventional superconducting wire having a square cross-section, and in that high current can flow therethrough by adjusting the number of times it is slit, and its manufacturing method is simple because it is not required to coat it with a stabilizing material.

Hereinafter, a preferred embodiment of the present invention will be described in detail with reference to the attached drawings. FIG. 1 is a schematic view showing a method of manufacturing round wire using superconducting tape according to the present invention.

As shown in FIG. 1, first, superconducting tape 10 is slit into strips of a predetermined size. The superconducting tape 10 is generally composed of a metal substrate, a buffer layer and a superconducting layer. The superconducting tape 10 used in the present invention includes metallic superconducting tape, such as NbTi, $Nb_3Sn$ or the like, and ceramic superconducting tape represented by Y-123, Bi-2223, Bi-2212 or the like.

The superconducting tape 10 is longitudinally slit in a width of 0.5~2.0 mm, and, if necessary, the width may be adjusted. The slit superconducting tape 20 is coated with silver (Ag) and then vertically laminated to form a superconducting tape laminate 30 having a square cross-section. The silver-coating of the slit superconducting tape 20 is realized by immersing the slit superconducting tape 20 in silver paste, and silver serves as a stabilizing material for a superconducting layer. Here, the slit superconducting tape 20 coated with silver may be vertically laminated in a row or in plural rows to form a superconducting tape laminate 30. In this case, since the superconducting tape laminate 30 has a thickness of 0.05~1.0 mm, it may be composed of 10~40 pieces of superconducting tape. These superconducting tape pieces may be vertically and horizontally laminated in an appropriate plural number depending on desired current capacity.

Subsequently, in order to hold the superconducting tape laminate 30, the superconducting tape laminate 30 may be spirally wound with silver wire 50 in its length direction or may be wound on a drum having a spiral groove.

Subsequently, the held superconducting tape laminate 40 is heat-treated at a temperature of 400~600° C. for 1~10 hours in an argon or nitrogen atmosphere. During the heat treatment, the held superconducting tape laminate 40 is joined with an adjacent superconducting tape laminate due to the diffusion junction between the silver-coated or silver-wound portion of the held superconducting tape laminate 40 and that of the adjacent superconducting tape laminate. Thus, a plurality of superconducting tape laminates are joined in parallel to each other, and high current flow can be realized depending on the number and shape of the superconducting tape laminates 30.

Subsequently, the heated superconducting tape laminate is thickly plated with copper to form a circular cross-section. Meanwhile, this copper also serves as the metal stabilizing material of the superconducting layer.

As described above, the round wire of the present invention includes a superconducting part 100 having a square section which is formed by slitting, silver-coating and laminating a superconducting tape, and a copper plating part 200 which is formed by copper-plating the superconducting part 100 to impart to it a circular cross-section. Therefore, the round wire of the present invention is advantageous in that its workability is good, in that a ceramic superconducting layer can be protected by silver-coating or copper-plating when it is a high-temperature round wire, and in that its superconducting layer is not damaged even though it is bent because silver and copper perform buffering action, so that it can be easily joined and wound. That is, it is expected that, like general copper wire, its application fields will be enlarged because it can be winded in a solenoid shape at the time of magnetic winding.

Further, the round wire of the present invention is advantageous in that, since it is formed by slitting, silver-coating and laminating conventional superconducting tape, its superconducting layer can be protected, and it has a circular cross-section, so that it can be easily joined and wound, with the result that it is expected that, like general copper wires, its application fields will be enlarged because it can be wound in a solenoid shape at the time of magnetic winding.

Furthermore, the round wire of the present invention is advantageous in that the number and shape of the superconducting tape laminates depending on the width of the slit superconducting tape can be adjusted, so that its critical current can be easily controlled, thereby enabling high current to flow therethrough, and in that an additional stabilizing procedure is not required because silver and copper serves as stabilizing materials.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing round wire using superconducting tape, comprising the steps of:
   slitting superconducting tape into superconducting tape strips;
   silver-coating the slit superconducting tape strips;
   laminating the silver-coated superconducting tape strips to form a superconducting tape laminate having a square cross-section;
   heat-treating the fixed superconducting tape laminate to cause diffusion junction between silver; and
   copper-plating the heat-treated superconducting tape laminate to have a circular section.

2. The method of manufacturing round wire using superconducting tape according to claim 1, wherein, in the holding of the superconducting tape laminate, the superconducting tape laminate is spirally wound with a silver wire.

3. The method of manufacturing a round wire using a superconducting tape according to claim 1, wherein, in the holding of the superconducting tape laminate, the superconducting tape laminate is wound on a drum having spiral grooves.

4. Round wire, comprising:
   a superconducting part having a square cross-section, which is formed by slitting, silver-coating and laminating superconducting tape; and
   a copper plating part, which is formed by copper-plating the superconducting part to have a circular cross-section.

* * * * *